(12) United States Patent
Chin et al.

(10) Patent No.: US 6,677,185 B2
(45) Date of Patent: Jan. 13, 2004

(54) METHOD OF AFFIXING A HEAT SINK TO A SUBSTRATE AND PACKAGE THEREOF

(75) Inventors: Hung Chin, Taipei (TW); Ching-Yi Hu, Taipei (TW)

(73) Assignee: Orient Semiconductor Electronics Limited, Kaohsiung (TW)

( * ) Notice: Subject to any disclaimer, the term of this patent is extended or adjusted under 35 U.S.C. 154(b) by 0 days.

(21) Appl. No.: 10/159,030

(22) Filed: Jun. 3, 2002

(65) Prior Publication Data

US 2003/0100147 A1 May 29, 2003

(30) Foreign Application Priority Data

Nov. 29, 2001 (TW) ........................ 90129769 A

(51) Int. Cl.⁷ .................. H01L 21/48; H01L 21/50
(52) U.S. Cl. ................ 438/122; 257/796; 257/675; 361/709
(58) Field of Search ................ 438/108, 127; 361/709; 257/796, 276, 675, 706, 717, 720; 228/222

(56) References Cited

U.S. PATENT DOCUMENTS 5,486,720 A  *  1/1996  Kierse ................ 257/659
6,278,182 B1 *  8/2001  Liu et al. .............. 257/712

* cited by examiner

*Primary Examiner*—Mathew Smith
*Assistant Examiner*—Calvin Lee
(74) *Attorney, Agent, or Firm*—Leong C. Lei

(57) ABSTRACT

A method of affixing a heat sink to a substrate and package thereof having a substrate with a position for receiving a semiconductor chip, at least a semiconductor chip for affixing on the position and electrically connecting the substrate, an appropriate thickness of adhesive agent by scraping by means of screen printing technology, a heat sink for covering the semiconductor chip and provided with a plurality of dimples for affixing to the substrate, the method including steps of affixing the semiconductor to the substrate and utilizing a scraper to apply a layer of adhesive agent with an appropriate thickness of adhesive on a platform from the adhesive agent; utilizing a sucker to move the heat sink to a position above the layer of adhesive agent, and dipping the dimples of the heat sink into the adhesive layer so as to adhere some adhesive agent onto the dimples, and then moving the heat sink above the semiconductor chip; affixing the heat sink to the substrate to cover the semiconductor chip; and enclosing the heat sink with epoxy resin to form a package.

4 Claims, 3 Drawing Sheets

METHOD OF AFFIXING A HEAT SINK TO A SUBSTRATE AND PACKAGE THEREOF

BACKGROUND OF THE INVENTION (a) Field of the Invention

This invention is related to a method of affixing a heat sink to a substrate and package of the heat sink and the substrate, wherein a chip is first affixed to a substrate and then covered with a heat sink for dissipating heat generated during the working of the chip.

(b) Description of the Prior Art

As far as we know, semiconductor chips will generally heat up while working. Therefore, it is necessary to use a heat sink to cover the chip in order to dissipate the heat generated by the semiconductor chip.

The conventional method of affixing and adhering a heat sink to a substrate is shown in FIGS. 1, 2A, 2B and 2C. As illustrated, a semiconductor chip 2' is first affixed on the substrate 1', and then a sprayer 4' is used to apply an adhesive agent 41' on the substrate 1' corresponding to the four dimples 31' on the bottom side of the heat sink 3'. Then the heat sink 3' is adjusted so that the dimples 31' are aligned with the adhesive agent 41' and moved to connect with the substrate. Finally, epoxy resin 5' is used to enclose the heat sink 3' to form a package.

However, such a method suffers from the following drawbacks: Firstly, since it is necessary to use the sprayer 4' to spray an appropriate amount of adhesive agent 41' to four positions corresponding to the dimples 31' of the heat sink 3', the physical and chemical properties of the adhesive agent 41' within the sprayer 4' and the decrease in the amount of the adhesive agent 41' will often change its viscosity, thereby causing the output of the adhesive agent being sprayed to vary. If less adhesive agent 41' is applied to the substrate, then the heat sink 3' cannot be firmly attached to the substrate, and so the heat sink will detach from the substrate after further treatment. If the adhesive agent is excessive, the electrical connection between the semiconductor chip and the substrate will be affected and may even be severed.

If the adhesive agent 41' is not applied to the correct position or the thickness of the adhesive agent 41' changes, the heat sink will not be firmly attached to the substrate, and may even cause the position of the heat sink to change.

In addition, it is necessary to apply the adhesive agent point by point, and the sprayer 4' must be positioned and cleaned again for each different package, thereby decreasing the manufacturing efficiency.

Therefore, it is an object of the present invention to provide a method which can obviate and mitigate the above-mentioned drawbacks.

SUMMARY OF THE INVENTION

This invention is related to a method of affixing a heat sink to a substrate and package of the heat sink and the substrate, wherein a chip is first affixed to a substrate and then covered with a heat sink for dissipating heat generated during the working of the chip.

It is the primary object of the present invention to provide a method of affixing a heat sink to a substrate which utilizes screen printing technology to apply a layer of adhesive agent with an appropriate thickness of adhesive on a platform from the adhesive agent thereby ensuring the heat sink to be affixed firmly on the substrate.

It is another object of the present invention to provide a method of affixing a heat sink to a substrate which can easily control the thickness of the layer of adhesive agent.

It is a further object of the present invention to provide a method of affixing a heat sink to a substrate which does not require the procedure of positioning and cleaning the nozzle.

According to a preferred embodiment of the present invention, a method of affixing a heat sink to a substrate and package thereof having a substrate with a position for receiving a semiconductor chip, at least a semiconductor chip for affixing on the position and electrically connecting the substrate, an appropriate thickness of adhesive agent by scraping by means of screen printing technology, a heat sink for covering the semiconductor chip and provided with a plurality of dimples for affixing to the substrate, the method comprising steps of affixing the semiconductor to the substrate and utilizing a scraper to apply a layer of adhesive agent with an appropriate thickness of adhesive on a platform from the adhesive agent; utilizing a sucker to move the heat sink to a position above the layer of adhesive agent, and dipping the dimples of the heat sink into the adhesive layer so as to adhere some adhesive agent onto the dimples, and then moving the heat sink above the semiconductor chip; affixing the heat sink to the substrate to cover the semiconductor chip; and enclosing the heat sink with epoxy resin to form a package.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

Figure 1:
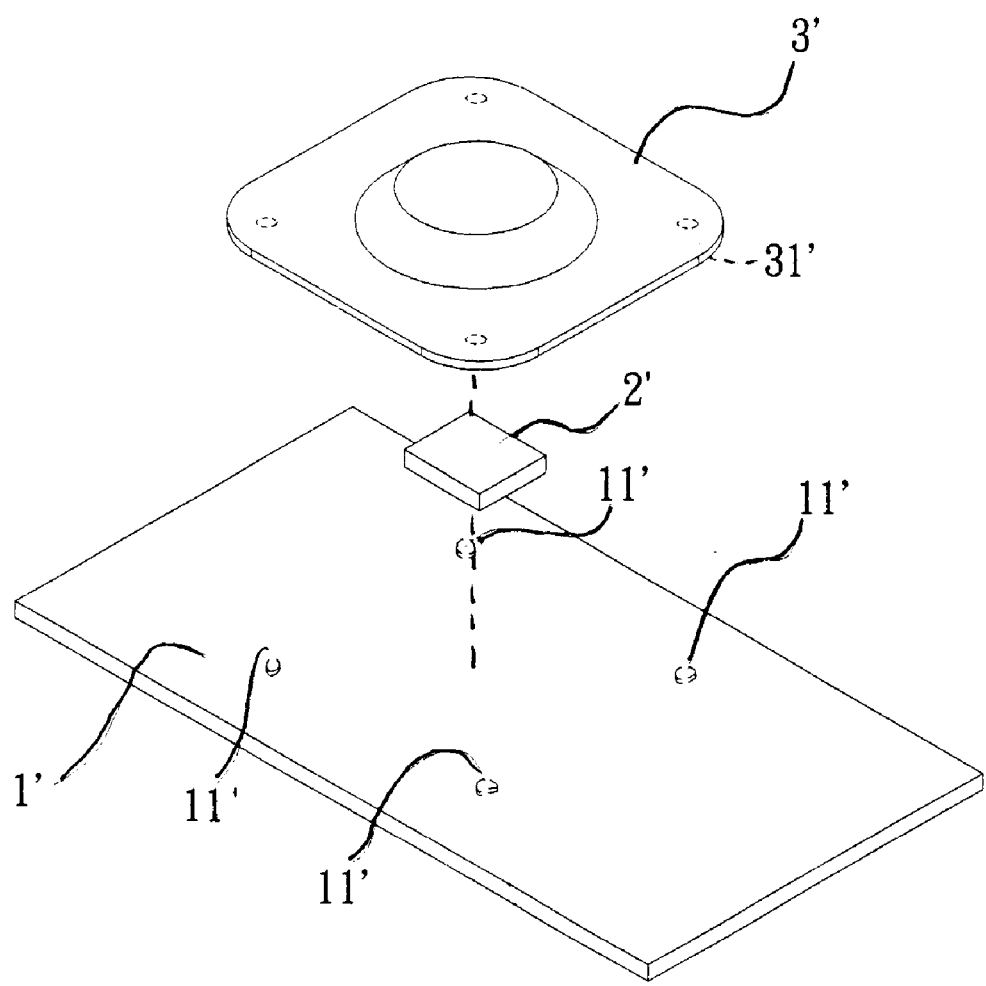
FIG. 1 is an exploded view illustrating the relationship between a heat sink, a chip and a substrate.
Figure 2A:
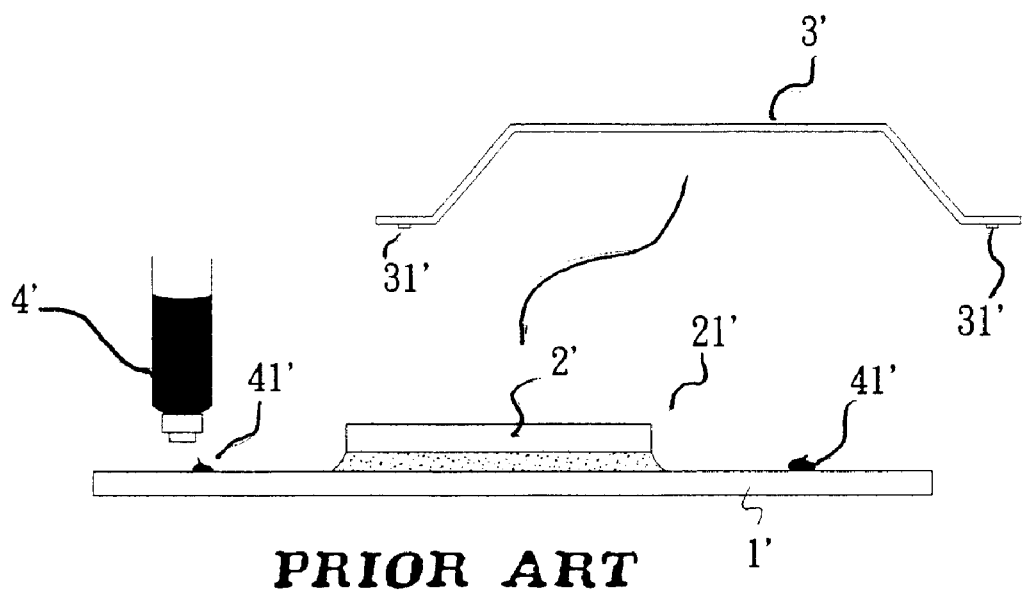
FIGS. 2A, 2B and 2C illustrate how to affix the heat sink to the substrate.
Figure 2B:
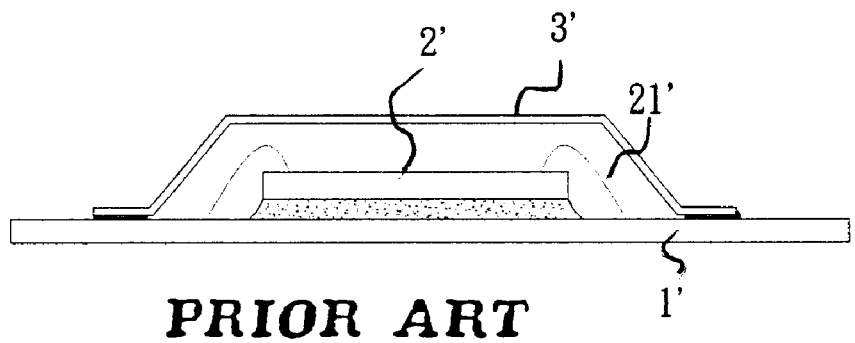
Figure 2C:
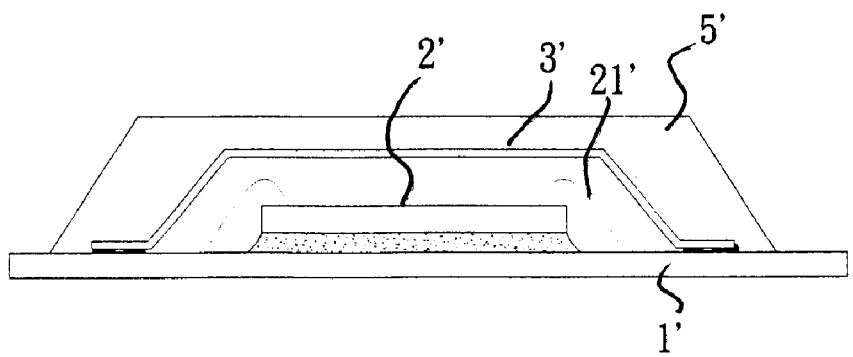
Figure 3A:
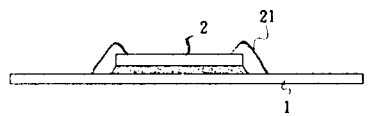
FIGS. 3A, 3B, 3C, 3D, 3E, 3F and 3G, 3H illustrate the method of affixing the heat sink to the substrate and the package of the heat sink, chip and the substrate according to the present invention.
Figure 3B:
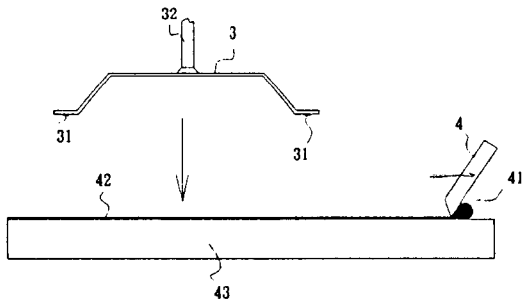
Figure 3C:
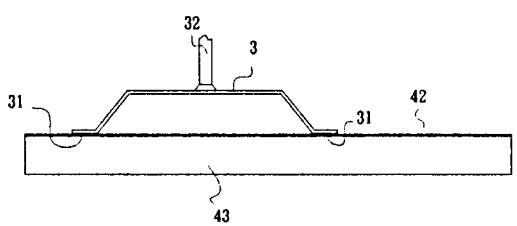
Figure 3D:
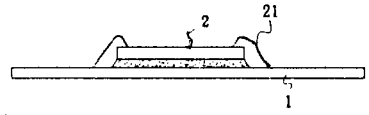
Figure 3E:
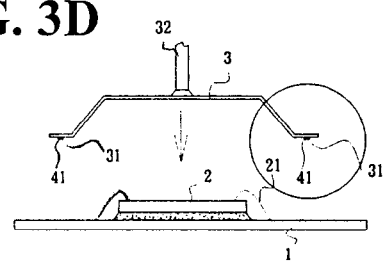
Figure 3H:
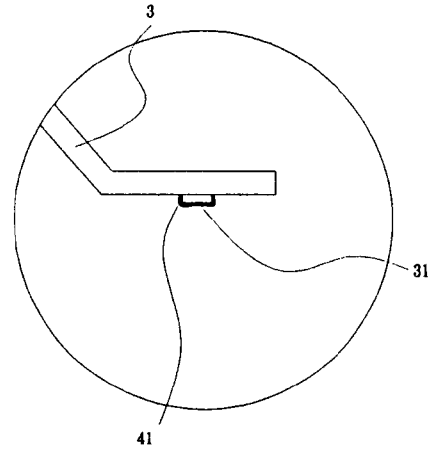
Figure 3F:
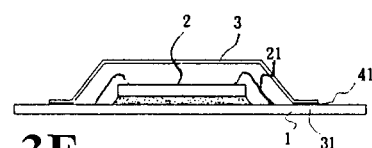
Figure 3G:
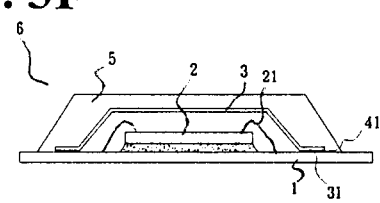

The following descriptions are of exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

The present invention comprises the following components:

a. a substrate 1 with a position for receiving a semiconductor chip 2;

b. at least a semiconductor chip 2 for affixing on the position and electrically connecting the substrate 1;

c. an appropriate thickness of adhesive agent by scraping by means of screen printing technology;

d. a heat sink 3 for covering the semiconductor chip 2 and provided with a plurality of dimples 31 for affixing to the substrate 1.

The method of affixing the heat sink 3 to the substrate 1 according to the present invention comprises the steps of:

a. affixing the semiconductor chip 2 to the substrate 1 by wire bonding and utilizing a scraper 4 to apply a layer of adhesive agent 41 with an appropriate thickness of adhesive on a platform 43 from the adhesive agent 41;

b. utilizing a sucker 32 to move the heat sink 3 to a position above the layer of adhesive agent 42, and dipping the dimples 31 of the heat sink 3 into the adhesive layer 42 so as to adhere some adhesive agent 42 onto the dimples 31, and then moving the heat sink 3 above the semiconductor chip 2;

c. affixing the heat sink 3 to the substrate 1 to cover the semiconductor chip 2; and d. enclosing the heat sink 3 with epoxy resin 5 to form a package.

It should be noted that the connection between the semiconductor chip 2 and the substrate 1 mentioned in step a. can be accomplished by flip chip technology.

Further, a portion of the heat sink 3 may not be covered by the epoxy resin 5 mentioned in the step d. for providing better heat dissipation effect.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A method of affixing a heat sink to a substrate and package thereof, having a substrate with a position for receiving a semiconductor chip, at least a semiconductor chip for affixing on said position and electrically connecting said substrate, an appropriate thickness of adhesive agent by scraping by means of screen printing technology, a heat sink for covering said semiconductor chip and provided with a plurality of dimples for affixing to said substrate, said method comprising steps of:

a. affixing said semiconductor to said substrate and utilizing a scraper to apply a layer of adhesive agent with an appropriate thickness of adhesive on a platform from said adhesive agent;

b. utilizing a sucker to move said heat sink to a position above said layer of adhesive agent, and dipping said dimples of said heat sink into said adhesive layer so as to adhere some adhesive agent onto said dimples, and then moving said heat sink above said semiconductor chip;

c. affixing said heat sink to said substrate to cover said semiconductor chip; and d. enclosing said heat sink with epoxy resin to form a package.

2. A method of affixing a heat sink to a substrate and package thereof as claimed in claim 1, wherein said semiconductor is affixed to said substrate by wire bonding.

3. The method of affixing a heat sink to a substrate and package thereof as claimed in claim 1, wherein connection between said semiconductor chip and said substrate is accomplished by flip chip technology.

4. The method of affixing a heat sink to a substrate and package thereof as claimed in claim 1, wherein a portion of said heat sink is not be covered by said epoxy resin.

\* \* \* \* \*